(12) United States Patent
Hildebrant et al.

(10) Patent No.: US 8,769,361 B2
(45) Date of Patent: *Jul. 1, 2014

(54) COST ESTIMATION FOR DEVICE TESTING

(75) Inventors: Andrew S. Hildebrant, Loveland, CO (US); Reid F. Hayhow, LaPorte, CO (US)

(73) Assignee: Advantest (Singapore) Pte Ltd, Singapore (SG)

( * ) Notice: Subject to any disclaimer, the term of this patent is extended or adjusted under 35 U.S.C. 154(b) by 3212 days.

This patent is subject to a terminal disclaimer.

(21) Appl. No.: 10/681,068

(22) Filed: Oct. 7, 2003

(65) Prior Publication Data

US 2005/0074735 A1    Apr. 7, 2005

(51) Int. Cl.
*G01R 31/28*     (2006.01)
*G01R 31/3183*   (2006.01)
*G11C 29/56*     (2006.01)
*G01R 31/319*    (2006.01)

(52) U.S. Cl.
CPC ........ *G01R 31/318342* (2013.01); *G11C 29/56* (2013.01); *G01R 31/31921* (2013.01)
USPC ........................................... 714/738; 365/63

(58) Field of Classification Search
CPC .. G11C 7/10; G11C 5/025; G01R 31/318342; G01R 31/318307; G01R 31/318392; G06F 11/27; G06F 11/263
USPC ......... 714/7, 726, 738, 740; 434/301; 438/14; 324/765; 365/63
See application file for complete search history.

(56) References Cited

U.S. PATENT DOCUMENTS

| | | | | |
|---|---|---|---|---|
| 4,493,079 | A | * | 1/1985 | Hughes, Jr. .................. 714/738 |
| 4,727,312 | A | * | 2/1988 | Fulks ............................ 714/738 |
| 4,760,377 | A | | 7/1988 | Jackson |
| 5,249,120 | A | * | 9/1993 | Foley ................................ 705/1 |
| 5,257,268 | A | * | 10/1993 | Agrawal et al. ............... 714/738 |
| 5,367,480 | A | * | 11/1994 | Matsumiya ..................... 365/63 |
| 5,434,869 | A | * | 7/1995 | Maekawa et al. ............. 714/740 |
| 5,825,787 | A | * | 10/1998 | Statovici ...................... 714/738 |
| 5,953,268 | A | | 9/1999 | Kuhara |
| 6,134,685 | A | | 10/2000 | Spano |
| 6,170,070 | B1 | | 1/2001 | Ju et al. |
| 6,424,926 | B1 | | 7/2002 | Mak |
| 6,574,626 | B1 | | 6/2003 | Regelman et al. |
| 6,598,112 | B1 | | 7/2003 | Jordan et al. |
| 6,687,855 | B1 | | 2/2004 | Krech et al. |
| 6,763,490 | B1 | | 7/2004 | Krech et al. |
| 6,813,741 | B1 | | 11/2004 | Ansel et al. |
| 6,925,584 | B2 | | 8/2005 | Padwekar et al. |
| 7,028,148 | B2 | | 4/2006 | Andoh |
| 7,185,295 | B2 | * | 2/2007 | Park et al. ......................... 716/4 |
| 2002/0093356 | A1 | * | 7/2002 | Williams et al. .............. 324/765 |
| 2002/0143418 | A1 | * | 10/2002 | Ohara et al. ..................... 700/95 |
| 2002/0162066 | A1 | * | 10/2002 | Khoche et al. ................ 714/738 |
| 2002/0184582 | A1 | * | 12/2002 | Pouya et al. .................. 714/726 |
| 2002/0184587 | A1 | * | 12/2002 | Boateng ....................... 714/738 |
| 2005/0074735 | A1 | | 4/2005 | Hildebrant et al. |
| 2005/0239494 | A1 | | 10/2005 | Klassen et al. |

* cited by examiner

*Primary Examiner* — Masud Ahmed
*Assistant Examiner* — Frank M Leiva

(57) ABSTRACT

Methods and systems for estimating cost for device testing are disclosed. In one embodiment, the method comprises reading a test file having a plurality of test vectors, determining a required memory needed to execute the plurality of test vectors, and using the required memory to estimate a cost to execute the test vectors.

17 Claims, 3 Drawing Sheets

COST ESTIMATION FOR DEVICE TESTING

BACKGROUND OF THE INVENTION

Prior to shipping a device, such as a system-on-a-chip (SOC), the device must be tested to determine whether it has been manufactured correctly and is fully operational. A variety of testers are available for such testing. Typically, a tester is a very large and expensive machine which is designed to precisely position the placement of logic signal transitions at very high speeds. Most testers are aimed at creating a "functional environment" for a device which mimics the environment in which the device will eventually be used, to thereby demonstrate that the device will behave as expected in that environment.

For functional tests, a tester applies a series of "test vectors" to the inputs of the device. A test vector is a critically timed cycle of events lasting a short period of time referred to as a "vector cycle". Within a vector cycle, and at precisely calculated times, logic signal drivers in the tester apply stimulus to device inputs. At the same or some precisely delayed time, logic signal comparators in the tester monitor responses at device outputs. When many test vectors are executed sequentially, discrepancies between monitored and expected device outputs, if any, are noted as device failures.

An alternative or adjunct to functional testing is "structural" testing (e.g., "scan" testing). Structural testing enables the testing of structures which are deeply embedded within a device. Rather than testing the device's internal structure by applying stimulus to the device's inputs, structural testing involves shifting a series of test vectors into the core of a device, and after each test vector is shifted in, launching the test vector and capturing a response. Each response is then shifted out of the device. In this manner, a tester can verify that all of a device's elements are present and operational. An assumption of structural testing is that if all elements are present and operational, then the elements will contribute to performing the greater and intended functions of the device (e.g., adding, shifting, etc.), and the device will function as designed.

Each type of test (functional, structural, or other types of tests) may have different memory requirements for the tester to execute the test vectors for each test to be performed. The requirements may also vary between different tests of each type. Currently, customers or test designers may not know the amount of memory required to execute their tests.

SUMMARY OF THE INVENTION

Methods and systems for estimating a cost to execute test vectors are disclosed. In one embodiment, the method comprises reading a test file having a plurality of test vectors. Next, a required memory needed to execute the plurality of test vectors is determined. The required memory is then used to estimate a cost to execute the test vectors.

BRIEF DESCRIPTION OF THE DRAWINGS

Illustrative embodiments of the invention are illustrated in the drawings in which.

DETAILED DESCRIPTION

Figure 1:
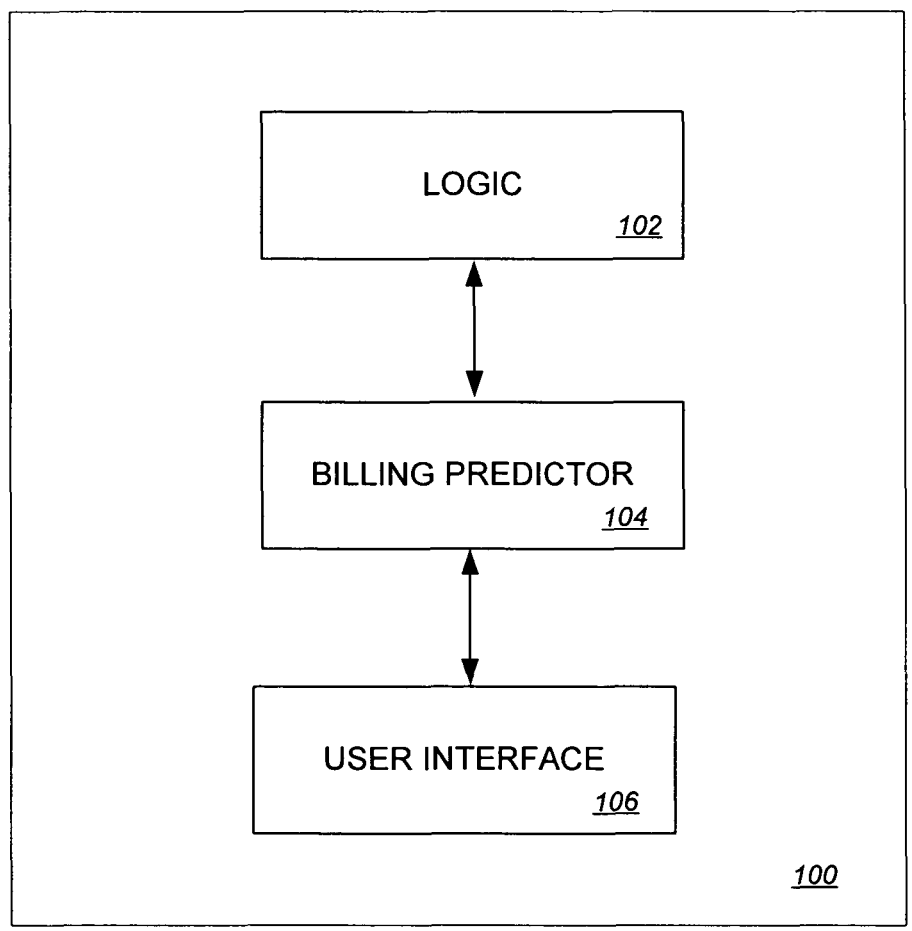
FIG. 1 illustrates an exemplary view of a system which may be used to determine a cost for device testing.

An exemplary embodiment of a system that may be used to estimate a cost to execute test vectors is illustrated in FIG. 1. The system 100 includes logic 102. As will be described in further detail below with reference to FIG. 2, logic 102 may be used to read a test file having a plurality of test vectors and to determine a required memory needed to execute the plurality of test vectors.

The system 100 also includes billing predictor 104 communicatively coupled to logic 102. The required memory determined by logic 102 is used by billing predictor 104 to estimate the cost to execute the test vectors. Cost estimating will also be described in further detail with reference to FIG. 2. In one embodiment, logic 102 and/or billing predictor 104 may be part of a design-to-test tool that is used to generate tests that can be read by a tester during device testing.

System 100 may additionally include user interface 106 communicatively coupled to billing predictor 104 and/or logic 102. User interface 106 may be used to display the cost to a user, such as a test designer. The user may then use the cost information to revise tests to meet a test budget. In one embodiment, costs may be displayed for multiple suppliers of test services and the user may use the information to choose a supplier to perform the tests. It should be appreciated that in alternate embodiments, system 100 may not include user interface 106.

In the configuration described above, different components were described as being communicatively coupled to other components. A communicative coupling is a coupling that allows communication between the components. This may be by means of a bus, cable, network, wireless mechanism, program code call (e.g., modular or procedural call) or other mechanism that allows communication between the components. Thus, it should be appreciated that logic 102, billing predictor 104, and user interface 106 may reside on the same or different physical devices. By way of example, user interface 106 may be a web browser on a remote client. It should also be appreciated that logic 102, billing predictor 104, and user interface 106 may be implemented in software, firmware, hardware or a combination of these.

Figure 2:
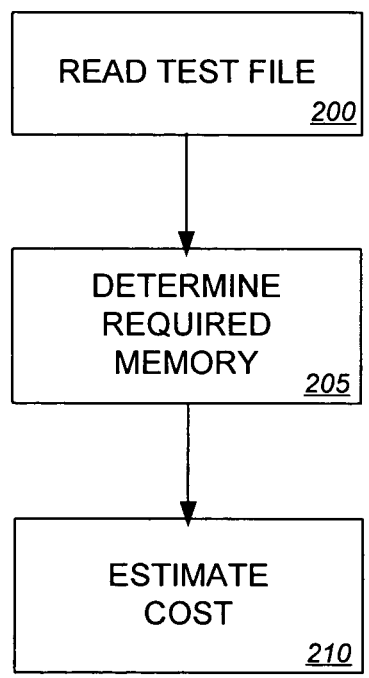
FIG. 2 illustrates an exemplary method that may be used by the system of FIG. 1 to estimate a cost to execute test vectors.

As shown in FIG. 2, logic 102 may be used to read 200 a test file containing one or more tests to be performed on a device, such as a system-on-a-chip (SOC). Each of the tests may include a plurality of test vectors to be applied to the device under test. Logic 102 may then determine 205 a required memory needed to execute the plurality of test vectors. By way of example, the number of test vectors for each test in the test file may be counted and the required memory may be determined to be equal to the number of test vectors required for the test with the highest number of test vectors.

The determination of the required memory may vary depending upon the configuration of the tester. In one embodiment, the tester that is used to test the device may include a plurality of boards. Each board may include a plurality of pins that may be used to drive inputs and receive outputs from the device under test. Each pin may include its own memory to use during the testing of the device. The memory may be used to store pin specific vector information. In alternate embodiments, memory may not be included on each pin, but may instead be included for each board or other component of the tester, or pooled in a central location and dynamically allocated by a centralized test processor.

In one embodiment, logic 102 may determine 205 an amount of pooled memory required for the tester to execute the test vectors. In another embodiment, a required memory needed for each board of a tester to execute the test vectors for the board may be determined. By way of example, in embodiments having a memory associated with each pin, a required memory needed for each board may be determined by determining the memory requirements for the pin with the highest memory usage. In a third embodiment, logic 102 may determine 205 the required memory needed for each pin to execute the vectors for the pin. Appropriate determinations 205 for other configurations are also contemplated.

Billing predictor 104 may use the required memory determined 205 by logic 102 to estimate a cost to execute the test vectors. The cost may be estimated by using a billing rate and billing scheme charged for the use of various amounts of memory. The billing rate/scheme may correlate to rates charged by a supplier of test services or may be rates charged to use memory of a tester. Additional factors, such as speed requirements, may also be taken into account when estimating the cost.

Figure 3:
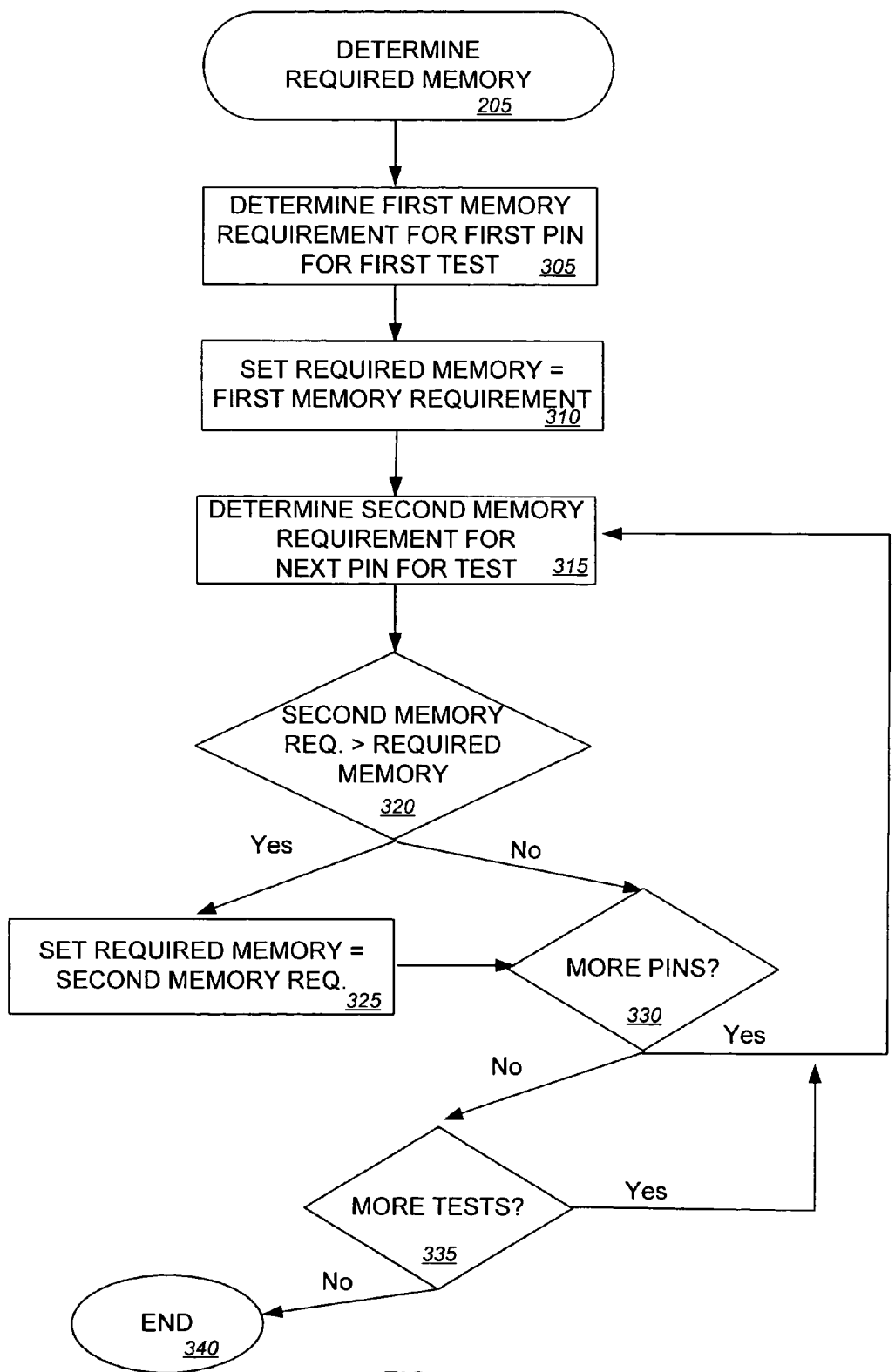
FIG. 3 illustrates an exemplary method for determining memory needed to execute test vectors for each pin of a tester that may be used by the method of FIG. 2.

FIG. 3 illustrates an exemplary embodiment of a method for determining 205 a required memory that may be used by logic 102. The method begins by determining 305 a first memory requirement for a first pin to execute the test vectors for a first test in the test file. By way of example, the first memory requirement may be determined 305 by counting the number of test vectors in the first test for the first pin. The required memory is then set 310 to be equal to the first memory requirement.

Another pin of the tester having test vectors in the first test is selected and a second memory requirement for the selected pin to execute the test vectors for the first test is determined 315. The second memory requirement may be determined 315 by counting the number of test vectors in the first test for the selected pin. If the second memory requirement exceeds the current value of the required memory 320, the required memory is set 325 equal to the second memory requirement.

After 325, or if the second memory requirement does not exceed the current value of the required memory 320, a determination is made as to whether there are more pins 330 having test vectors in the first test to process. If there are more pins, processing continues back at 315 for the next pin. Otherwise, a determination is made as to whether there are more tests in the test file 335.

If there are more tests, 315-330 are repeated for the next test for each pin having test vectors to execute for the test. After all the tests have been processed, the method ends 340. Thus, it should be appreciated that at the conclusion of the method the required memory is determined to be equal to the memory requirements for the test and pin combination with the highest memory requirements.

In alternate embodiments, the required memory may be determined in a manner different from that shown in FIG. 3. The determination 205 may depend upon how available memory is allocated in the tester. For example, in one embodiment, the memory available for a pin may depend on the board where the pin is located. Pins on one board may have the same amount of memory available as other pins on the same board, while the amount of memory available for pins may vary between boards. In this embodiment, a required memory may be calculated for each board by determining the memory requirements for the test and pin combination with the highest memory requirements for each board using a method similar to that described in FIG. 3. In a second embodiment, memory may be allocated on a per pin basis. In this embodiment, a required memory may be determined for each pin. Other exemplary embodiments, such as embodiments with one memory available for all the pins of a board, may use corresponding different calculations.

The billing predictor 104 may use various billing rates and schemes that correlate to the configuration of the tester to estimate the cost required to execute the tests. By way of example, in a per pin configuration, billing predictor may use a rate charged for memory to calculate costs to use the required memory for each pin and then total the costs. Correspondingly different calculations may be made for different test environments, such as one memory for tester, or configuration in which all pins on a board are given the same amount of memory but memory can vary between boards.

The cost estimated 205 by billing predictor 104 may then be displayed to a user. Additional information, such as the test requiring the most memory, may also be provided. The user may use this information to find the lowest cost supplier of test services and/or to reconfigure their tests to meet a test budget.

While illustrative and presently preferred embodiments of the invention have been described in detail herein, it is to be understood that the inventive concepts may be otherwise variously embodied and employed, and that the appended claims are intended to be construed to include such variations, except as limited by the prior art. It should also be appreciated that the methods described above may be performed by hardware components or may be embodied in sequences of machine-executable instructions, which may be used to cause a machine, such as a general-purpose or special-purpose processor or logic circuits programmed with the instructions to perform the actions set forth in FIGS. 2 and 3. Alternatively, the methods may be performed by a combination of software, firmware, and hardware.

What is claimed is:

1. A machine-executable method comprising:
   executing sequences of instructions on a machine, the executed sequences of instructions causing the machine to perform the actions of,
   reading a test file having a plurality of test vectors;
   determining a required memory needed to execute the plurality of test vectors; and
   using the required memory to estimate a cost to execute the test vectors.

2. The method of claim 1, wherein the executed sequences of instructions further cause the machine to perform the action of receiving a billing scheme; wherein using the required memory to estimate a cost includes using the billing scheme to estimate the cost to execute the test vectors.

3. The method of claim 1, wherein determining a required memory comprises determining a required memory needed for each of a plurality of boards of a tester to execute the test vectors for the board.

4. The method of claim 1, wherein determining a required memory comprises determining a required memory needed for each of a plurality of pins of a tester to execute the test vectors for the pin.

5. The method of claim 1, wherein determining a required memory comprises counting the number of test vectors for each of one or more tests in the test file.

6. The method of claim 1, wherein determining a required memory comprises:
   determining a first memory requirement needed for a first pin of a tester to execute the test vectors for a first test in the test file;
   setting the required memory equal to the first memory requirement; and
   for each additional pin of the tester, determining a second memory requirement needed for the additional pin to execute the test vectors for the first test; and if the second memory requirement is greater than the first memory requirement, setting the required memory equal to the second memory requirement.

7. The method of claim 6, wherein the executed sequences of instructions further cause the machine to perform the action of, for each additional test in the test file:

for each pin of the tester, determining a third memory requirement for the pin to execute the test vectors for the additional test; and setting the required memory equal to the third memory requirement if the third memory requirement is greater than the required memory.

8. A system comprising:

a machine programmed to execute sequences of instructions, wherein execution of the sequences of instructions defines, logic to read a test file having a plurality of test vectors and to determine a required memory needed to execute the plurality of test vectors; and a billing predictor, communicatively coupled to the logic, to use the required memory to estimate a cost to execute the test vectors.

9. The system of claim 8, wherein the machine further comprises a user interface to display the cost to a user.

10. The system of claim 8, further comprising a tester having a plurality of boards; wherein the logic is to determine a required memory needed for each board of the tester to execute the test vectors for the board.

11. The system of claim 8, further comprising a tester having a plurality of boards, each board including a plurality of pins;

wherein the logic is to determine a required memory needed for each pin to execute the test vectors for the pin.

12. The system of claim 8, wherein the logic is to determine the required memory by counting the number of test vectors for each test in the test file.

13. One or more machine-readable mediums having stored thereon sequences of instructions, which, when executed by a machine, cause the machine to perform the actions:

reading a test file having a plurality of test vectors;

determining a required memory needed to execute the plurality of test vectors; and using the required memory to estimate a cost to execute the test vectors.

14. The machine-readable mediums of claim 13, further comprising instructions, which when executed by the machine, cause the machine to perform the actions of receiving a billing scheme; and wherein the instructions for using the required memory to estimate a cost include instructions, which when executed by the machine, cause the machine to perform the actions of using the billing scheme to estimate the cost to execute the test vectors.

15. The machine-readable mediums of claim 13, wherein the instructions for determining a required memory comprise instructions, which when executed by the machine, cause the machine to perform the actions of determining a required memory needed for each of a plurality of boards of a tester to execute the test vectors for the board.

16. The machine-readable mediums of claim 13, wherein the instructions for determining a required memory comprise instructions, which when executed by the machine, cause the machine to perform the actions of determining a required memory needed for each of a plurality of pins of a tester to execute the test vectors for the pin.

17. The machine-readable mediums of claim 13, wherein the instructions for determining a required memory comprise instructions, which when executed by the machine, cause the machine to perform the actions:

determining a first memory requirement needed for a first pin of a tester to execute the test vectors for a first test in the test file;

setting the required memory equal to the first memory requirement; and for each additional pin of the tester, determining a second memory requirement needed for the additional pin to execute the test vectors for the first test; and if the second memory requirement is greater than the first memory requirement, setting the required memory equal to the second memory requirement.

* * * * *